United States Patent [19]

Ristig

[11] 4,068,087

[45] Jan. 10, 1978

[54] PREFABRICATED SHIELDED CABIN

[75] Inventor: Eberhard Ristig, Etterzhausen, Germany

[73] Assignee: Siemens Aktiengesellschaft, Berlin and Munich, Germany

[21] Appl. No.: 702,572

[22] Filed: July 6, 1976

[30] Foreign Application Priority Data

July 14, 1975 Germany .............................. 2531452

[51] Int. Cl.² .............................................. H05K 9/00
[52] U.S. Cl. .................................. 174/35 MS; 52/584
[58] Field of Search ........... 174/35 R, 35 GC, 35 MS; 361/424; 220/4 F; 52/584

[56] References Cited

U.S. PATENT DOCUMENTS

| 2,838,592 | 6/1958 | Feketics | 174/35 MS |
|---|---|---|---|
| 3,217,085 | 11/1965 | Lindgren | 174/35 MS |
| 3,334,175 | 8/1967 | Vinvent | 174/35 MS |
| 3,340,587 | 9/1967 | Beyer | 174/35 MS |

*Primary Examiner*—J. V. Truhe
*Assistant Examiner*—D. A. Tone
*Attorney, Agent, or Firm*—Hill, Gross, Simpson, Van Santen, Steadman, Chiara & Simpson

[57] ABSTRACT

A prefabricated shielded cabin which is shielded such that it is impermeable to high frequency radiation is assembled from individual prefabricated parts. The prefabricated parts or panels have a frame of solid tubes and half tubes welded around metal sheets. To assemble a cabin the half tubes are placed over the solid tubes. A mechanical connection between the half and solid tubes is provided with the aid of tubular clamps which slide over the half and solid tubes. Bolts are not required to assemble the shielded cabin of this invention.

11 Claims, 6 Drawing Figures

PREFABRICATED SHIELDED CABIN

BACKGROUND OF THE INVENTION

1. Field of the Invention

The invention relates to easily disassembleable shielded cabins consisting of individual prefabricated wall, ceiling and bottom panels. More particularly, the invention relates to a shielded cabin in which the prefabricated panels have dimensions which are as similar as possible and in which the prefabricated panels attach to one another in high frequency impermeable fashion by special attachment means which provide gapless contacts between panels via special contact spring elements.

2. Description of the Prior Art

Shielded cabins are preferred in those situations where rapid changeability of location for space shielding is of decisive significance or in which a permanent shielding arrangement is not acceptable for cost reasons. Disassembleable shielded cabins are known which have serially constructed individual panels in accordance with assembly line techniques. As a result of the serial construction of individual component parts, such shielded cabins are especially economical. They are constructed in such a way that they can be set up in a short time and, in need be, also be taken down again without difficulty for use elsewhere. Additionally, it is also possible by use of mechanical assembly principles, to subsequently expand cabins or to spacially rearrange them. The assembly of cabins is done from the inside out so that they can be set up in the immediate vicinity of permanent walls.

With a commercially known shielded cabin arrangement, the load bearing frame of the individual panels consists of a rectangular profile of chrome steel to which a sheet steel portion is permanently attached by welding. The individual panels are connected to one another by special nuts and bolts. Special spring elements are used in an attempt to provide gapless contacts between panels. As accessories, doors and windows are provided which, when closed, are impermeable to high frequency radiation. Ventilator inserts, lighting and power supply lines bypassed for high frequencies are also common.

U.S. Pat. No. 2,838,592 discloses a shielded cabin in which individual panels consist of wood portions sheathed on one or two sides with sheet metal. Attachment of individual panels to one another is accomplished by bolting.

U.S. Pat. No. 3,217,085 discloses a shielded cabin in which individual panels having sheet metal portions are provided in which edges of the panels are flanged at the 90° angle. Interconnections between individual panels is accomplished with the aid of U-shaped members which are placed over abutting flanged edges and bolted onto them. Bolting is provided on the outside of the cabin.

SUMMARY OF THE INVENTION

It is an object of the present invention to provide a disassembleable shielded cabin which may be produced and assembled in a more simplified manner than the known cabins yet provides improved shielding effects.

The object of this invention is achieved by providing panels having frames of cylindrical solid tubes and/or longitudinally cut away half tubes. These frames are attached to the outside surface of sheet metal portions of the panels. The half tubes can be placed over the solid tubes and adjacent panels fixed in place when assembling the cabin by use of tube clamps which are pushed onto the tubes.

The grasping of the circular tubes by the half tubes provides a very high electromagnetic shielding effect since contact surfaces are substantially longer than known constructions and of uniform width. This uniformity results from the increased rigidity of tubes with circular cross-section vis-a-vis those with rectangular cross-section. Furthermore, production is simplified since only three different types of circular tube or half tube stock is required; namely, two stock types for the production of the frame and one stock type for the production of tube clamps. This stock is commercially available as endless extrusions.

Preferably, the frame and sheet metal portions of the panels consist of ferromagnetic material such as chrome steel. To improve the electrical conductivity and thus the shielding effect for high frequencies, the frame and sheet metal portions of the panels are provided with a surface which has good electrical conductivity.

During assembly, a corrugated contact spring is perferably arranged between the circular solid tube and the half tube. This contact spring serves as a tolerance compensator to improve electrical contact. Other spring elements can be used in place of a corrugated sheet.

In a preferred embodiment of the shielded cabin of this invention, the panels are at least partially rectangular. In this form, the frames consists of two solid and two half tubes respectively joined at corners. These frames are arranged such as to provide two types of panels which are mirror symmetrical with respect to their frames. During assembly of the panels to form a shielded cabin, the mirror symmetrical panels are arranged at opposite sides of the cabin from each other.

In another preformed form of the invention, the panels of the cabin are square. With square panels, there are several possibilities for assembling using frames of either solid or half tubes. In one form of the invention, three types of square panels are provided wherein the frames consist only of solid or half tubes of three solid tubes and one half tube, or of three half tubes and one solid tube.

A particularly advantageous form of the invention employs square panels having two circular solid and two half tubes respectively joined at corners. With such an embodiment, only a single type of panel is necessary for assembling the entire cabin. This embodiment is especially suitable for serial construction such as on an assembly line.

DESCRIPTION OF THE PREFERRED EMBODIMENTS

Figure 1:
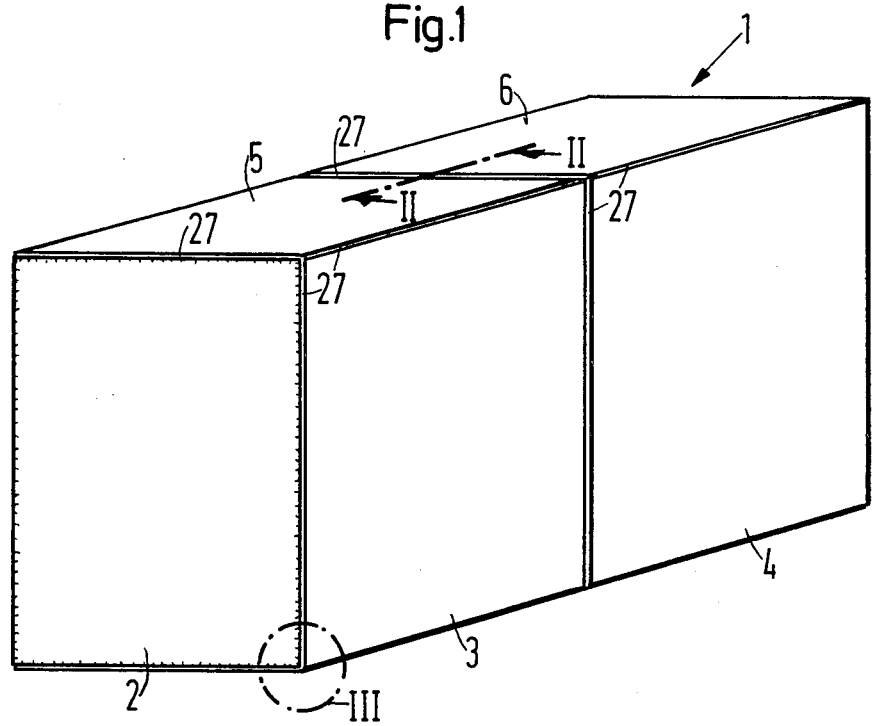
FIG. 1 is a perspective view showing the outside of the disassembleable shielded cabin of this invention.

The outside of the disassembleable shielded cabin of this invention is illustrated at 1 in FIG. 1. Cabin 1 is composed of a total of ten individual panels including an end panel 2, two side panels 3 and 4, and two top panels 5 and 6 shown in FIG. 1. At the junction points between panels, a solid tube 27 which forms the frame can be seen.

Figure 2:
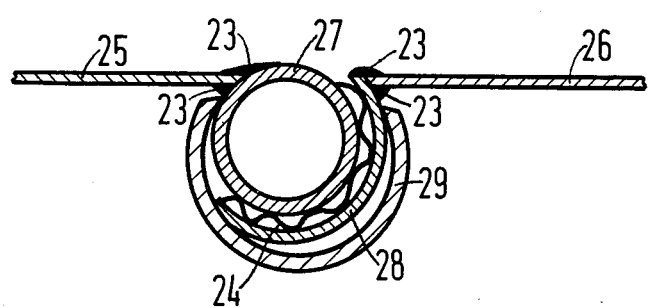
FIG. 2 is a partial cross-sectional view taken along line II—II of FIG. 1.

In FIG. 2, a solid circular tube 27 is shown to which a metal sheet 25 is welded with the aid of welding seams 23. A half tube 28 is also shown to which a further metal sheet 26 is welded at welding seams 23. Half tube 28 grips around solid tube 27. In the gap between half tube 28 and solid tube 27 a corrugated contact spring 24 is arranged for improving electrical contact as well as for compensating contact tolerances between adjacent panels. A connection for mechanical strength is provided by a flexible tube clamp 29.

By use of tubes having circular cross-section, the contact area between tubes 27 and 28 is greater than in known constructions without the use of additional space. The disadvantage inherent in previous constructions was the bowing which occurred when two metal sheets lying flat against one another were bolted together. The contact was only good under the bolts since intervening spaces between the bolts had poor electrical contact due to the bowing. Such a disadvantage no longer occurs when the tubular profiles of this invention are used.

Figure 3:
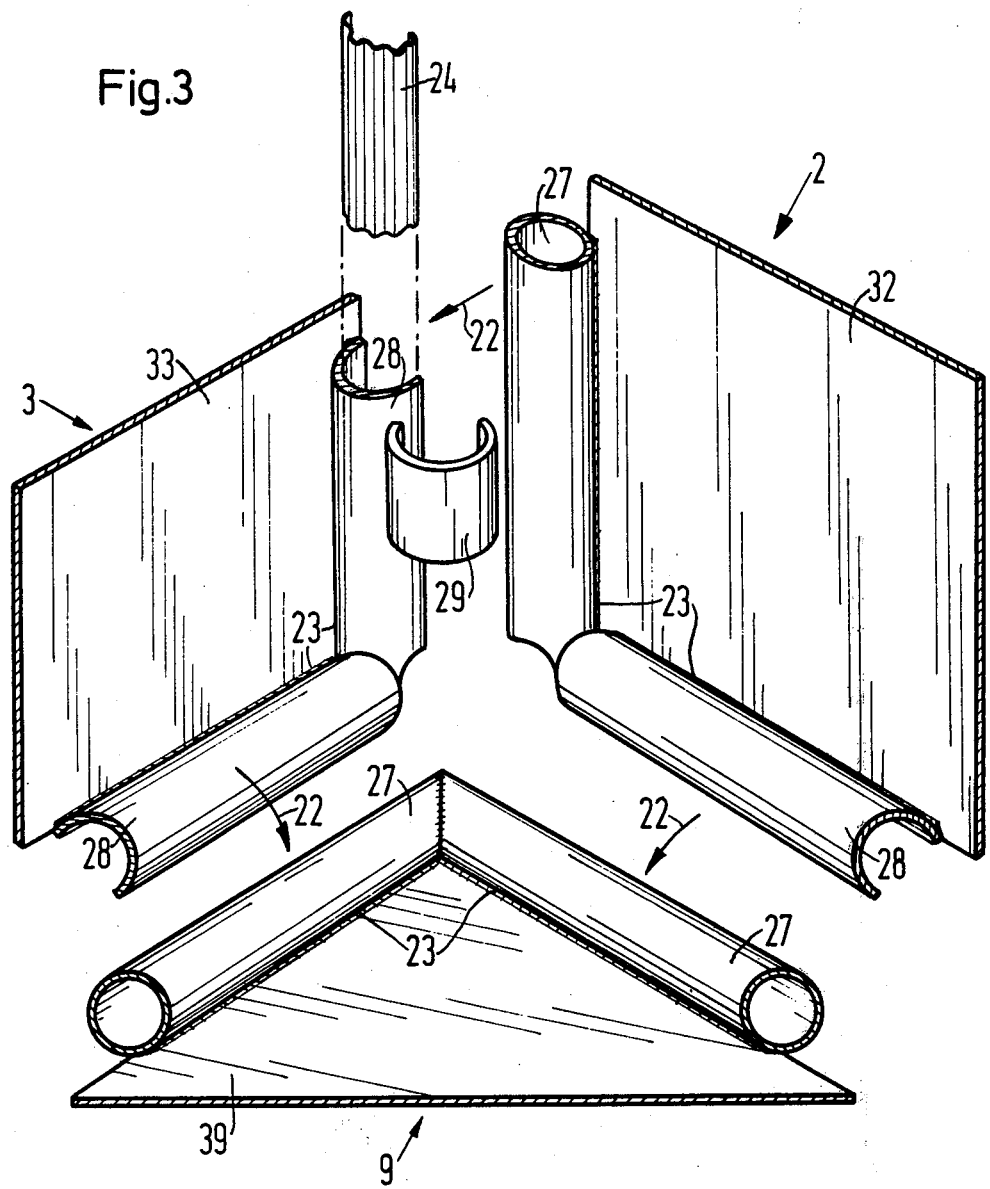
FIG. 3 is an exploded perspective view of an inside corner of the shielded cabin of this invention.

In FIG. 3 the constructional aspects of a corner of the shielded cabin are shown in detail. A portion of a bottom panel 9 can be seen having a sheet 39 through which solid tubes 27 forming a frame are welded at 23. The tubes come together in a corner and are attached to one another there. A side panel 3 is also shown having a sheet 33 through which two half tubes 28 are welded at welding seams 23. These half tubes also attach to one another at a corner. In the corner the half tubes are cut away such that when they are set onto solid tubes 27 of the bottom panel 9 as shown by arrow 22, they provide a gapless closure. A side panel 2 is also shown having a sheet 32 to which a half tube 28 and a solid tube 27 are attached at welding seams 23. In this case the half tubes or the solid tubes are cut away in the corner such that when the three panels 9, 3, and 2 are assembled, a gapless junction results. A corrugated contact spring element 24 is placed between half tube 28 and solid tube 27. Finally, a tubular clamp 29 may be slipped over half tube 28 to produce a mechanical connection in tight engagement between the tubes.

Figure 4:
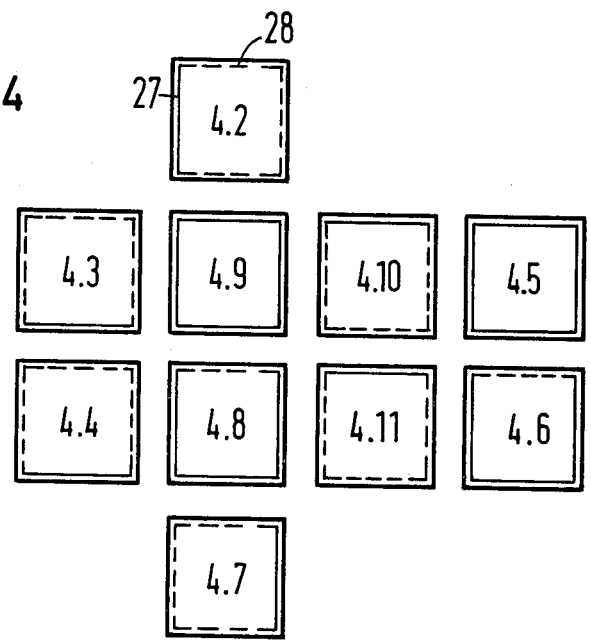
FIGS. 4, 5 and 6 are diagrams illustrating assembly of panels for the shielded cabin of this invention.

The individual panels required for assembling the cabin of FIG. 1 are shown in FIG. 4. These individual panels have a square outline. Two bottom panels 4.8 and 4.9, two top panels 4.5 and 4.6, two end panels 4.2 and 4.7, and four side panels 4.3, 4.4, 4.10 and 4.11 are shown. In this arrangement, three different types of individual panels are required. These types are: panels 4.5 and 4.9 having frames consisting only of solid tubes 27 (shown in the drawing as a solid line); panels 4.8 and 4.6 having frames consisting of three solid tubes 27 and a half tube 28 (shown in the drawing as a broken line); and panels 4.2, 4.3, 4.4, 4.7, 4.10 and 4.11 having frames consisting of three half tubes 28 and one solid tube 27.

Figure 5:
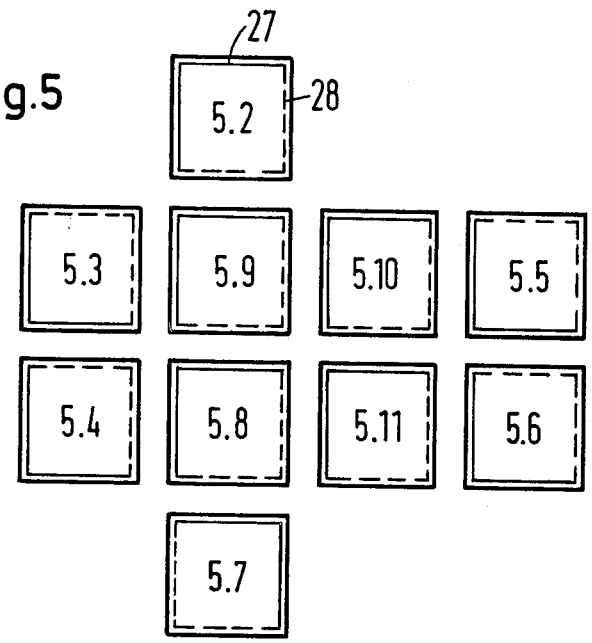

In an alternate embodiment shown in FIG. 5, square panels are used which are all identical. In panels 5.2 to 5.11, the frame consists of two solid tubes 27 coming together in one corner and two half tubes 28 coming together in a diagonally opposite corner.

Figure 6:
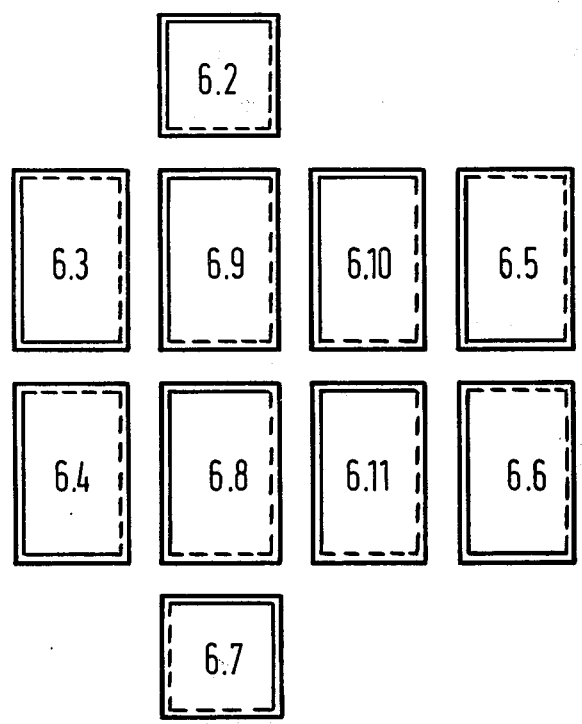

Finally, FIG. 6 illustrates another embodiment in which rectangular panels are used. Side panels 6.3 and 6.4 as well as top panels 6.5 and 6.6 are identical to one another in frame arrangement. Bottom panels 6.8 and 6.9 and side panels 6.10 and 6.11 are also identical to one another. These bottom and side panels are mirror symmetrical with respect to the side and top panels specified above.

Although only three embodiments of individual panels are indicated in the drawings, other embodiments and variations adapted to the purposes of this invention are obvious. It is an objective, however, to endeavor to use basic panel designs which differ from one another as little as possible to permit cost saving assembly line production.

Although various minor modifications may be suggested by those versed in the art, it should be understood that I wish to embody within the scope of a patent warranted herein, all such embodiments as reasonably and properly come within the scope of my contribution to the art.

I claim as my invention:

1. A disassembleable, shielded cabin which is impermeable to high frequency radiation comprising:
    a. individual prefabricated wall, ceiling, and bottom panels, a majority of said panels having substantially uniform peripheral dimensions, each panel having a sheet metal portion and a load bearing frame attached thereto in a manner impermeable to high frequency radiation;
    b. some of said load bearing frames comprising circular solid tubes and other load bearing frames comprising cut away half tubes, said half tubes engaging the circular tubes of adjacent panels;
    c. contact spring elements located in contact with and between said half tubes and said circular tubes;
    d. tubular clamps disposed over said cut away half tubes and engaging said circular tubes to maintain the engagement to fix in place assembled panels; and
    e. said sheet metal portions being attached to said load-bearing frame at the outside of the shielded cabin.

2. The cabin according to claim 1, in which the frame and sheet metal portions consist of ferromagnetic material.

3. The cabin according to claim 2, in which the frame and sheet metal portions are provided with an electrically conductive surface.

4. The cabin of claim 2 in which the ferromagnetic material comprises chrome steel.

5. The cabin according to claim 1 in which said contact spring elements comprise a corrugated contact spring provided between the circular tube and the half tube engaging the circular tube.

6. The cabin according to claim 1 in which the ceiling, bottom, and some of the wall panels of the cabin are rectangular, the frames of these panels each consisting of two circular and two half tubes, the two circular tubes coming together at a corner, the two half tubes coming together at a corner, at least one rectangular wall panel having a frame which is the mirror image of a frame on at least one other rectangular wall panel, at least one bottom panel having a frame which is the mirror image of a frame on at least one ceiling panel.

7. The cabin of claim 1 in which all of the panels are square.

8. The cabin of claim 1 in which three types of panels are provided the frames of which respectively comprise all circular tubes, three circular tubes with one half tube, and three half tubes with one circular tube.

9. The cabin of claim 1 in which only one type of panel is provided and the frames consist in each case of two circular tubes coming together at a corner and two half tubes coming together at a corner.

10. The cabin of claim 1 in which at least six wall panels, two ceiling panels, and two bottom panels are provided.

11. A disassembleable, shielded cabin which is impermeable to high frequency radiation comprising:
   a. individual prefabricated wall, ceiling, and floor panels, a majority of said panels having substantially uniform peripheral dimensions, each panel having a sheet metal portion and a load bearing frame continuously attached without gaps around the sheet metal periphery;
   b. some of said load bearing frames comprising circular tubes and other load bearing frames comprising cut away half tubes, said cut away half tubes fitting around a portion of said circular tubes on adjacent panels;
   c. contact spring elements in gapless contact along substantially the entire longitudinal length between said cut away half tubes and said circular tubes; and
   d. tubular clamps disposed over said cut away half tubes around said circular tubes to fix in place assembled panels of the cabin.

* * * * *